(12) United States Patent
Kadoguchi et al.

(10) Patent No.: US 10,312,211 B2
(45) Date of Patent: Jun. 4, 2019

(54) METHOD OF MANUFACTURING SEMICONDUCTOR DEVICE

(71) Applicant: TOYOTA JIDOSHA KABUSHIKI KAISHA, Toyota-shi, Aichi-ken (JP)

(72) Inventors: Takuya Kadoguchi, Toyota (JP); Naoya Take, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/341,379

(22) Filed: Nov. 2, 2016

(65) Prior Publication Data

US 2017/0141068 A1  May 18, 2017

(30) Foreign Application Priority Data

Nov. 16, 2015 (JP) .................................. 2015-224317

(51) Int. Cl.
*H01L 23/00* (2006.01)
*B23K 35/00* (2006.01)
(Continued)

(52) U.S. Cl.
CPC .............. *H01L 24/27* (2013.01); *B23K 35/00* (2013.01); *H01L 23/4334* (2013.01); *H01L 23/49513* (2013.01); *H01L 23/49537* (2013.01); *H01L 23/49562* (2013.01); *H01L 23/49575* (2013.01); *H01L 23/49582* (2013.01); *H01L 24/05* (2013.01); *H01L 24/29* (2013.01); *H01L 24/32* (2013.01); *H01L 24/83* (2013.01); *H01L 25/072* (2013.01); *H01L 23/49551* (2013.01); *H01L 24/33* (2013.01); *H01L 2224/04026* (2013.01);
(Continued)

(58) Field of Classification Search
CPC ........................... H01L 24/27; H01L 23/4334
USPC ......................................................... 438/612
See application file for complete search history.

(56) References Cited

U.S. PATENT DOCUMENTS

2003/0111728 A1\* 6/2003 Thai .................. H01L 23/49513
257/735
2004/0235221 A1\* 11/2004 Taguchi ................ H01L 21/563
438/108

(Continued)

FOREIGN PATENT DOCUMENTS

CN   101996969 A   3/2011
JP   2007-067158 A  3/2007
(Continued)

*Primary Examiner* — Mohammad M Choudhry
(74) *Attorney, Agent, or Firm* — Oliff PLC

(57) ABSTRACT

A method of manufacturing a semiconductor device which includes a first member and a second member joined to the first member includes: a) producing $(Cu,Ni)_6Sn_5$ on a Ni film formed on the first member by melting a first Sn—Cu solder containing 0.9 wt % or higher of Cu on the Ni film of the first member; b) producing $(Cu,Ni)_6Sn_5$ on a Ni film formed on the second member by melting a second Sn—Cu solder containing 0.9 wt % or higher of Cu on the Ni film of the second member; and c) joining the first member and the second member to each other by melting the first Sn—Cu solder having undergone step a) and the second Sn—Cu solder having undergone step b) so that the first Sn—Cu solder and the second Sn—Cu solder become integrated.

14 Claims, 19 Drawing Sheets

(51) Int. Cl.
*H01L 25/07* (2006.01)
*H01L 23/433* (2006.01)
*H01L 23/495* (2006.01)

(52) U.S. Cl.
CPC ........... *H01L 2224/05155* (2013.01); *H01L 2224/05639* (2013.01); *H01L 2224/05644* (2013.01); *H01L 2224/05655* (2013.01); *H01L 2224/27334* (2013.01); *H01L 2224/27436* (2013.01); *H01L 2224/27849* (2013.01); *H01L 2224/291* (2013.01); *H01L 2224/293* (2013.01); *H01L 2224/29111* (2013.01); *H01L 2224/29211* (2013.01); *H01L 2224/29294* (2013.01); *H01L 2224/29347* (2013.01); *H01L 2224/32145* (2013.01); *H01L 2224/32227* (2013.01); *H01L 2224/32503* (2013.01); *H01L 2224/33181* (2013.01); *H01L 2224/83447* (2013.01); *H01L 2224/83815* (2013.01); *H01L 2924/014* (2013.01); *H01L 2924/0105* (2013.01); *H01L 2924/01028* (2013.01); *H01L 2924/01029* (2013.01); *H01L 2924/3651* (2013.01)

(56) References Cited

U.S. PATENT DOCUMENTS

| | | | |
|---|---|---|---|
| 2007/0057021 A1 | | 3/2007 | Ikeda et al. |
| 2011/0042815 A1* | | 2/2011 | Ikeda .................. H01L 23/488 |
| | | | 257/762 |
| 2016/0126204 A1 | | 5/2016 | Kadoguchi et al. |
| 2016/0126207 A1 | | 5/2016 | Kadoguchi |

FOREIGN PATENT DOCUMENTS

| | | | |
|---|---|---|---|
| JP | 2008-098212 A | | 4/2008 |
| JP | 2010-147245 A | | 7/2010 |
| JP | 2010090433 | * | 8/2010 |
| JP | 4569423 B2 | | 10/2010 |
| JP | 2011-044624 A | | 3/2011 |
| JP | 2012-028589 A | | 2/2012 |
| JP | 5517694 B2 | | 6/2014 |
| JP | 2016-092063 A | | 5/2016 |
| JP | 2016-092064 A | | 5/2016 |

* cited by examiner

| SOLDER COMPOSITION | Cu CONCENTRA-TION (wt%) | SMALLNESS OF AMOUNT OF Ni LOSS | | UNLIKELINESS OF PRODUCTION OF $(Ni,Cu)_3Sn_4$ | |
|---|---|---|---|---|---|
| | | SOLDERING | HIGH-TEMPERATURE DURABILITY (200°C) | SOLDERING | HIGH-TEMPERATURE DURABILITY (200°C) |
| Sn-0.7Cu | 0.7 | Ref | Ref | Ref | Ref |
| Sn-0.9Cu | 0.9 | ○ | ○ | ○ | ○ |
| Sn-1.4Cu | 1.4 | ○ | ○ | ○ | ○○ |
| Sn-1.5Cu | 1.5 | ○ | ○ | ○ | ○○ |
| Sn-1.6Cu | 1.6 | ○ | ○ | ○ | ○○○ |
| Sn-1.7Cu | 1.7 | ○ | - | ○ | - |
| Sn-2.7Cu | 2.7 | ○ | - | ○ | - |
| Sn-3.0Cu | 3.0 | ○ | - | ○ | - |
| Sn-3.2Cu | 3.2 | ○ | - | ○ | - |

Sn-0.7Cu, 500h

Sn-0.9Cu, 500h

Sn-1.4Cu, 500h

Sn-1.5Cu, 500h

Sn-1.6Cu, 500h

Sn-0.7Cu, 250h

Sn-0.9Cu, 250h

Sn-1.4Cu, 500h

Sn-1.5Cu, 500h

Sn-1.6Cu, 1000h

METHOD OF MANUFACTURING SEMICONDUCTOR DEVICE

INCORPORATION BY REFERENCE

The disclosure of Japanese Patent Application No. 2015-224317 filed on Nov. 16, 2015 including the specification, drawings and abstract is incorporated herein by reference in its entirety.

BACKGROUND

1. Technical Field

The present disclosure relates to a method of manufacturing a semiconductor device.

2. Description of Related Art

In a semiconductor device, for example, two or more members such as a semiconductor element or a lead frame are joined to each other using a solder. In a case where two members are joined to each other using a solder, a technique of providing a Ni film such as a nickel (Ni) plating on a surface of each of the members has been widely performed in order to prevent excessive growth of an intermetallic compound in a joint interface between the two members. However, in a case where the Ni film is exposed to a high temperature of, for example, 200° C. for a long period of time, an intermetallic compound (for example, $Ni_3Sn_4$) may be produced between the Ni film and the solder. In this case, the joining strength decreases.

Japanese Patent Application Publication No. 2007-67158 (JP 2007-67158 A) discloses a method of manufacturing a semiconductor device using a Sn—Cu solder containing $Cu_6Sn_5$. This manufacturing method includes: a step of disposing a Sn—Cu solder between two members; and a step of producing $(Cu,Ni)_6Sn_5$ on a Ni film of each of the members by heating and melting the Sn—Cu solder. According to this manufacturing method, $(Cu,Ni)_6Sn_5$ produced on the Ni film functions as a barrier layer which prevents conversion of the Ni film into an intermetallic compound such that a decrease in the joining strength of a joint interface between the solder and the Ni film can be prevented.

In the manufacturing method disclosed in JP 2007-67158 A, by melting the solder between two members, $(Cu,Ni)_6Sn_5$ is produced on the respective Ni films of the two members at the same time. In this case, while the solder is melted between the two members, a portion of $Cu_6Sn_5$ included in the solder moves to one member to produce $(Cu,Ni)_6Sn_5$, and another portion of $Cu_6Sn_5$ moves to the other member to produce $(Cu,Ni)_6Sn_5$. Here, it is difficult to uniformly heat the solder disposed between the two members. For example, a temperature distribution of the solder during heating may be non-uniform in a thickness direction thereof. At this time, in a region of the solder contacting one member, an increase in the temperature of the solder is rapid, and the solder is melted quickly; whereas, in a region of the solder contacting the other member, an increase in the temperature of the solder is slow, and the solder is melted slowly. In this case, the production of $(Cu,Ni)_6Sn_5$ is started in one member, whereas the production of $(Cu,Ni)_6Sn_5$ is delayed in the other member. As a result, most of $Cu_6Sn_5$ included in the solder is consumed in one member, and thus a predetermined amount of $(Cu,Ni)_6Sn_5$ may not be produced in the other member.

In order to address this problem, for example, a technique of increasing the Cu concentration in a Sn—Cu solder may be considered. As the Cu concentration increases, the amount of $Cu_6Sn_5$ included in the solder also increases. When the solder contains an abundant amount of $Cu_6Sn_5$, the amount of $(Cu,Ni)_6Sn_5$ required for each surface of two members can be produced even in a case where $(Cu,Ni)_6Sn_5$ is non-uniformly produced between the two members. However, as the Cu concentration increases in a Sn—Cu solder, the melting temperature (liquidus temperature) also increases (refer to FIG. 22). Accordingly, when the Cu concentration of a Sn—Cu solder used increases, it is necessary to heat the solder to a higher temperature in a solder melting step. For example, in the manufacturing method disclosed in JP 2007-67158 A, a Sn—Cu solder containing 3 wt % to 7 wt % of Cu is used, and the melting temperature thereof is about 330° C. to 400° C.

SUMMARY OF THE INVENTION

The embodiments provide a technique of producing a predetermined amount of $(Cu,Ni)_6Sn_5$ on a Ni film of each of the members to be connected by solder, even in a case where a Sn—Cu solder having a relatively low Cu concentration is used in a method of manufacturing a semiconductor device in which two or more members are joined to each other through a Sn—Cu solder.

A method of manufacturing a semiconductor device according to one aspect in which a second member is joined to a first member, includes: a) producing $(Cu,Ni)_6Sn_5$ on a Ni film formed on the first member by melting a first Sn—Cu solder containing 0.9 wt % or higher of Cu on the Ni film of the first member; b) producing $(Cu,Ni)_6Sn_5$ on a Ni film formed on the second member by melting a second Sn—Cu solder containing 0.9 wt % or higher of Cu on the Ni film of the second member; and c) joining the first member and the second member to each other by melting the first Sn—Cu solder having undergone step a) and the second Sn—Cu solder having undergone step b) so that the first Sn—Cu solder and the second Sn—Cu solder become integrated. The first heat treatment step and the second heat treatment step may be performed at the same time or at different times. The order of the first heat treatment step and the second heat treatment step is not particularly limited. The Ni film is not limited to a pure Ni film and may include phosphorus (P) or other elements.

In the above-described manufacturing method, before combining the first member and the second member, step a) may be performed on the first member, and step b) may be performed on the second member. In the first heat treatment step, $(Cu,Ni)_6Sn_5$ is produced on the Ni film of the first member using the first Sn—Cu solder. In the second heat treatment step, $(Cu,Ni)_6Sn_5$ is produced on the Ni film of the second member using the second Sn—Cu solder different from the first Sn—Cu solder. Unlike in the manufacturing method disclosed in JP 2007-67158 A, $Cu_6Sn_5$ included in one solder is not shared by two members. Therefore, even in a case where the Cu concentrations in the first and second Sn—Cu solders are relatively low, a predetermined amount of $(Cu,Ni)_6Sn_5$ can be produced on each of the Ni films of the first member and the second member. In a case where the Cu concentration in the first Sn—Cu solder is 0.9 wt % or higher, $(Cu,Ni)_6Sn_5$ is produced on the Ni film of the first member in an amount in which it can function as a barrier layer. The same applies to the second Sn—Cu solder. After step a) and step b), the first member and the second member are combined (placed together), and step c) is performed thereon. As a result, the first member and the second member can be joined to each other.

BRIEF DESCRIPTION OF THE DRAWINGS

Features, advantages, and technical and industrial significance of exemplary embodiments will be described below with reference to the accompanying drawings, in which like numerals denote like elements, and wherein:

FIG. 7 is a table showing the results of soldering which was performed while changing the Cu concentrations in the first solder 14 and the second solder 24;

DETAILED DESCRIPTION OF EMBODIMENTS

A soldering method first will be described. In this soldering method, as shown in FIGS. 1 to 4, a first member 10 and a second member 20 are joined to each other using a first solder 14 and a second solder 24. This soldering method can be applied to the manufacturing of various industrial products. Accordingly, the first member 10 and the second member 20 are not limited to specific members. For example, the first member 10 and the second member 20 are two of plural members constituting a semiconductor device. In this case, the soldering method disclosed in this specification can be applied to any of soldering between a semiconductor element and a conductive member (for example, a lead frame), soldering between a conductive member and a conductive member, or soldering between a semiconductor element and another semiconductor element.

Figure 1:
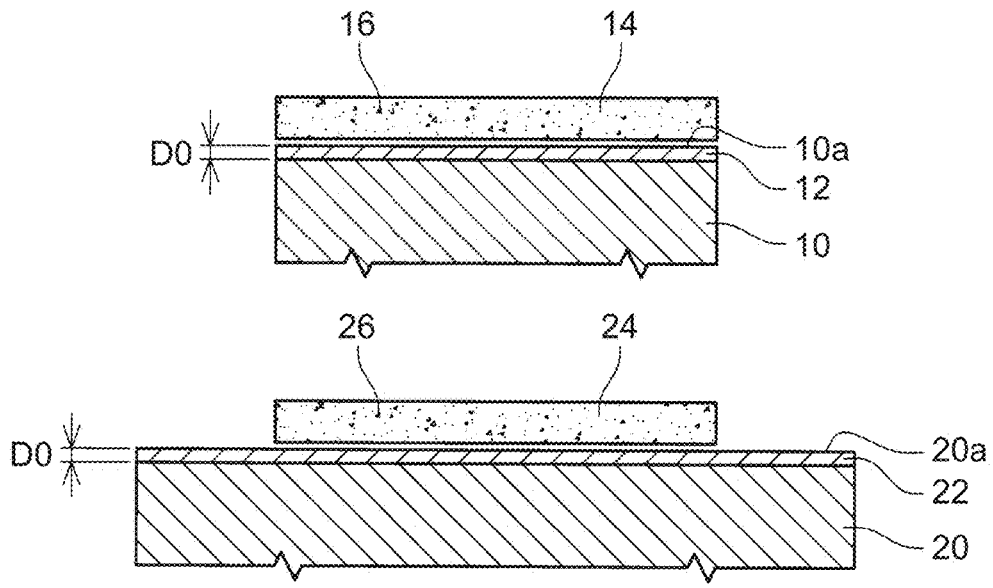
FIG. 1 is a diagram showing a first member 10, on which a first solder 14 is disposed, and a second member 20, on which a second solder 24 is disposed, in a step of a soldering method.

First, as shown in FIG. 1, the first solder 14 is disposed on a surface 10a of the first member 10, and the second solder 24 is disposed on a surface 20a of the second member 20. A Ni film 12 is formed on the surface 10a of the first member 10. Here, the Ni film refers to a metal layer containing nickel (Ni) as a major component and is, for example, an electroless Ni—P plating layer or an electroplating Ni layer. The Ni film 12 is provided to prevent excessive growth of an intermetallic compound in a joint interface between the first member 10 and the first solder 14. An initial thickness D0 of the Ni film 12 is not particularly limited and, for example, is several micrometers to several hundreds of micrometers. Likewise, a Ni film 22 is formed on the surface 20a of the second member 20. The Ni films 12, 22 may be covered with another metal film formed of gold (Au), Ag (silver), or the like to prevent corrosion. The metal film is diffused into the solders 14, 24 while the solders 14, 24 are melted during a first heat treatment step or a second heat treatment step described below.

Each of the first solder 14 and the second solder 24 is a Sn—Cu solder obtained by adding copper (Cu) to tin (Sn) and includes $Cu_6Sn_5$ (reference numerals 16, 26) which is an intermetallic compound of Cu and Sn. Although the details will be described below, it is preferable that each of the solders 14, 24 contains 0.9 wt % or higher of Cu. Each of the solders 14, 24 may have various forms such as a sheet form, a wire form, a paste form. The Cu concentration in the first solder 14 and the Cu concentration in the second solder 24 may be the same as or different from each other.

Figure 2:
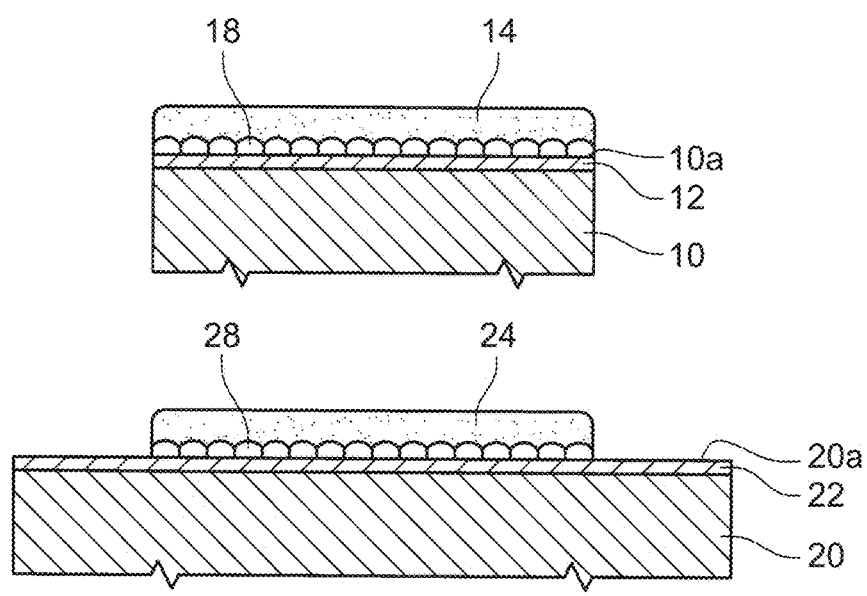
FIG. 2 is a diagram showing the first member 10 having undergone a first heat treatment step and the second member 20 having undergone a second heat treatment step in a step of the soldering method.
Figure 22:
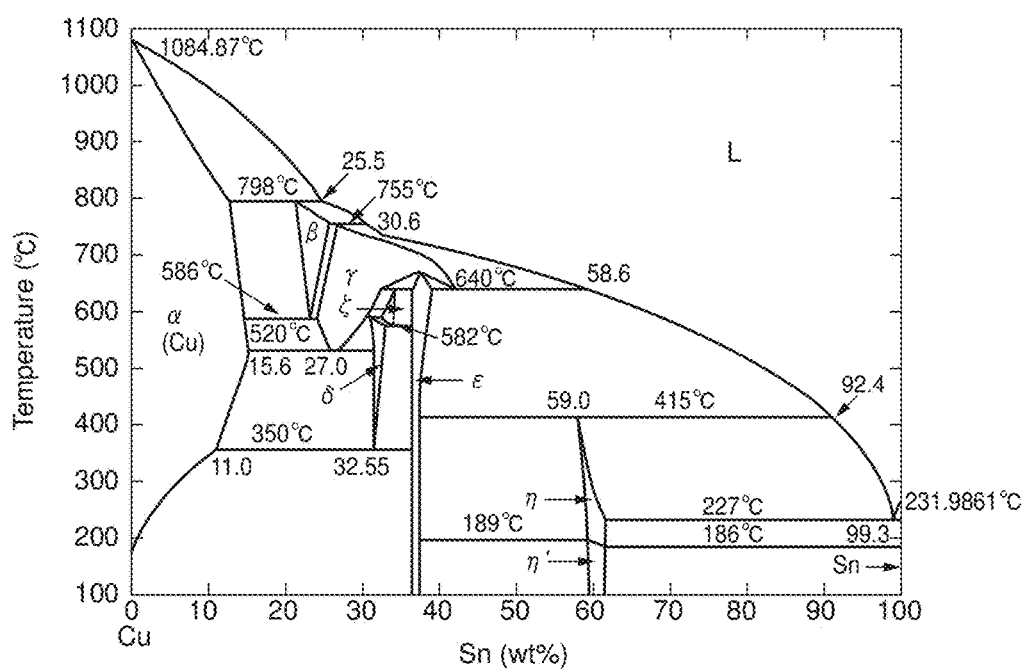
FIG. 22 is a state diagram (phase diagram) of a Sn—Cu solder.

Next, as shown in FIG. 2, a first heat treatment step of heating the first solder 14 disposed on the first member 10, and a second heat treatment step of heating the second solder 24 disposed on the second member 20 are performed. The first heat treatment step and the second heat treatment step may be performed at the same time or at different times. The first heat treatment step and the second heat treatment step may be performed at positions which are physically separated from each other. In the first heat treatment step, the first solder 14 is melted on the Ni film 12 of the first member 10 by heating the first solder 14. That is, in the first heat treatment step, the first solder 14 is heated to a melting temperature (liquid phase point) or higher. Here, as can be seen from a phase diagram of FIG. 22, the melting temperature of the Sn—Cu solder varies depending on the Cu concentration in the Sn—Cu solder. As the Cu concentration increases, the melting temperature also increases. For example, in a case where the Cu concentration is 0.9 wt %, the melting temperature of the Sn—Cu solder is 230° C. to 235° C. Regarding this point, the lower the Cu concentration in the first solder 14, the better. The same applies to the second solder 24 described below.

When the first solder 14 is melted, $Cu_6Sn_5$ included in the first solder 14 moves to the Ni film 12 to produce $(Cu,Ni)_6Sn_5$ (reference numeral 18). As a result, the first member 10 and the first solder 14 are strongly connected to each other. $(Cu,Ni)_6Sn_5$ covers the Ni film 12 so as to function as a barrier layer which prevents production of $Ni_3Sn_4$. In the first heat treatment step, a melting time during which the first solder 14 remains molten is, for example, 3 minutes to 10 minutes. However, the melting time is not limited to 3 minutes to 10 minutes and can be appropriately set in consideration of the time required to produce a predetermined amount of $(Cu,Ni)_6Sn_5$. The amount of $(Cu,Ni)_6Sn_5$ produced on the Ni film 12 varies depending on the Cu concentration in the first solder 14. As the Cu concentration increases, the amount of $(Cu,Ni)_6Sn_5$ produced also increases. Regarding this point, the lower the Cu concentration in the first solder 14, the better. The same applies to the second solder 24 described below.

Likewise, in the second heat treatment step, the second solder 24 is melted on the Ni film 22 of the second member 20 by heating the second solder 24. That is, in the second heat treatment step, the second solder 24 is heated to a melting temperature (liquid phase point) or higher. When the second solder 24 is melted, $Cu_6Sn_5$ included in the second solder 24 moves to the Ni film 22 to produce $(Cu,Ni)_6Sn_5$ (reference numeral 28). $(Cu,Ni)_6Sn_5$ covers the Ni film 22 so as to function as a barrier layer which prevents production of $Ni_3Sn_4$. In the second heat treatment step, a melting time during which the second solder 24 remains molten is, for example, 3 minutes to 10 minutes. However, the melting time can be appropriately set in consideration of the time required to produce a predetermined amount of $(Cu,Ni)_6Sn_5$. The melting time in the second heat treatment step may be the same as or different from the melting time in the first heat treatment step. In a case where the Ni film 12 of the first member 10 and the Ni film 22 of the second member 20 are covered with other metal films such as Au or Ag, these metal films are diffused into the solders 14, 24 while the solders 14, 24 are melted. Therefore, $(Cu,Ni)_6Sn_5$ is also produced on the Ni films 12, 22.

Figure 3:
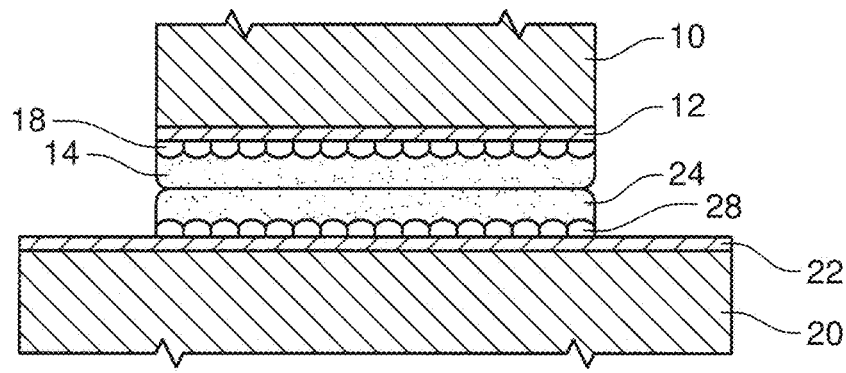
FIG. 3 is a diagram showing a state where the first member 10 having undergone the first heat treatment step and the second member 20 having undergone the second heat treatment step are combined (placed together) in a step of the soldering method.

Next, as shown in FIG. 3, the first member 10 and the second member 20 are combined (placed together) such that the first solder 14 and the second solder 24 face each other. At this time, the first solder 14 and the second solder 24 may be in direct contact with each other, or another solder or another member may be provided between the first solder 14 and the second solder 24.

Figure 4:
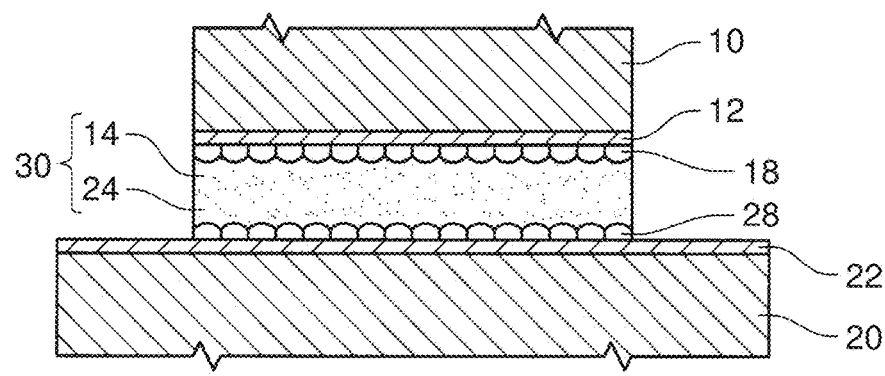
FIG. 4 is a diagram showing the first member 10 and the second member 20 having undergone a third heat treatment step in a step of the soldering method.

Next, as shown in FIG. 4, a third heat treatment step of heating the first solder 14 and the second solder 24 is performed. In the third heat treatment step, the first solder 14 having undergone the first heat treatment step and the second solder 24 having undergone second heat treatment step are melted such that the first and second solders 14, 24 become integrated. Next, when the first solder 14 and the second solder 24 are solidified, a solder joint layer 30 in which the solders 14, 24 are integrated is formed between the first member 10 and the second member 20 such that the first member 10 and the second member 20 are joined to each other. In the third heat treatment step, when each of the solders 14, 24 is melted only for a short period of time, the solders 14, 24 can become integrated. Accordingly, in the third heat treatment step, the melting time during which the solders 14, 24 remain molten may be set to, for example, several seconds. Accordingly, the melting time in the third heat treatment step can be appropriately set in consideration of various conditions and can be set to be shorter than each of the melting times in the first heat treatment step and the second heat treatment step.

In the above-described soldering method, before combining the first member 10 and the second member 20, the first heat treatment step is performed on the first member 10, and the second heat treatment step is performed on the second member 20. In the first heat treatment step, $(Cu,Ni)_6Sn_5$ is produced on the Ni film 12 of the first member 10 using the first solder 14. In the second heat treatment step, $(Cu,Ni)_6Sn_5$ is produced on the Ni film 22 of the second member 20 using the second solder 24 different from the first solder 14. On the other hand, in a soldering method of the related art, by melting a common solder between two members, $(Cu,Ni)_6Sn_5$ is produced on the respective Ni films of the two members at the same time and from the same solder. In this method, $Cu_6Sn_5$ included in the solder is shared by the two members. Therefore, in a case where an excess amount of $(Cu,Ni)_6Sn_5$ is produced in one member, $(Cu,Ni)_6Sn_5$ is not sufficiently produced in the other member. On the other hand, according to the soldering method disclosed in this specification, $Cu_6Sn_5$ included in one solder is not shared by the first member 10 and second member 20. Accordingly, even in a case where the Cu concentrations in the first solder 14 and the second solder 24 are relatively low, a predetermined amount of $(Cu,Ni)_6Sn_5$ can be produced on each of the Ni films 12, 22 of the first member 10 and the second member 20. In a case where the Cu concentrations in the first solder 14 and the second solder 24 decrease, each of the melting temperatures of the first solder 14 and the second solder 24 also decreases (refer to FIG. 22). Accordingly, a target temperature to which the first solder 14 is heated in the first heat treatment step and a target temperature to which the second solder 24 is heated in the second heat treatment step can be decreased. In a case where the target temperatures can be decreased, for example, the amount of energy consumption required for each of the heat treatment steps can be reduced. Alternatively, adverse effects on various members which are heated together with the first solder 14 or the second solder 24 can be avoided.

Figure 5A:
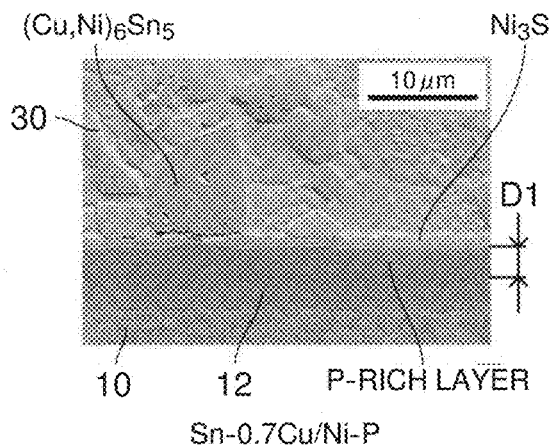
FIG. 5A is an electron micrograph showing a joint interface between a Ni film 12 (Ni—P) and a solder joint layer 30 having undergone soldering (the third heat treatment step)
Figure 5B:
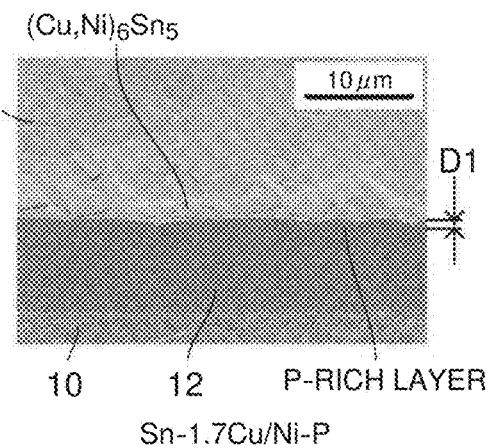
FIG. 5B is an electron micrograph showing a joint interface between a Ni film 12 (Ni—P) and a solder joint layer 30 having undergone soldering (the third heat treatment step)
Figure 5C:
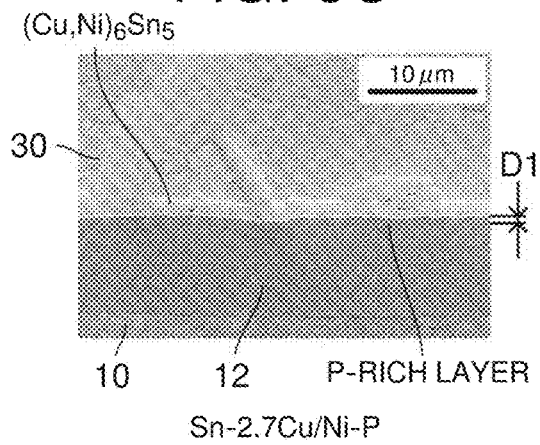
FIG. 5C is an electron micrograph showing a joint interface between a Ni film 12 (Ni—P) and a solder joint layer 30 having undergone soldering (the third heat treatment step)
Figure 5D:
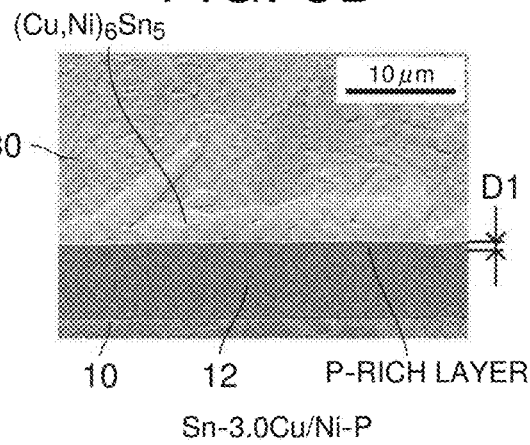
FIG. 5D is an electron micrograph showing a joint interface between a Ni film 12 (Ni—P) and a solder joint layer 30 having undergone soldering (the third heat treatment step)
Figure 5E:
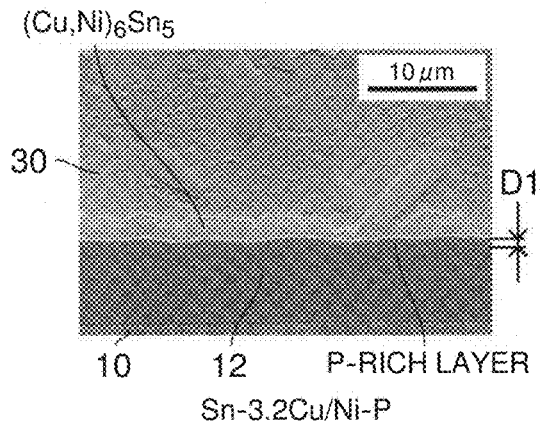
FIG. 5E is an electron micrograph showing a joint interface between a Ni film 12 (Ni—P) and a solder joint layer 30 having undergone soldering (the third heat treatment step)

Next, the Cu concentrations in the first solder 14 and the second solder 24 are investigated. As described above, as the Cu concentration in the first solder 14 increases, the amount of $(Cu,Ni)_6Sn_5$ produced on the Ni film 12 increases, and a preferable barrier layer can be formed. Since the same applies to the second solder 24, hereinafter, the first solder 14 will be described as an example. FIGS. 5A to 5E are electron micrographs showing a joint interface between the Ni film 12 and the solder joint layer 30 having undergone soldering. In each of the micrographs of FIGS. 5A to 5E, the first member 10 is Cu, and the Ni film 12 is an electroless Ni—P plating layer. The Cu concentrations in the first solders 14 of FIGS. 5A to 5E are 0.7 wt %, 1.7 wt %, 2.7 wt %, 3.0 wt %, and 3.2 wt %, respectively. As shown in FIG. 5A, in a case where the Cu concentration in the first solder 14 is 0.7 wt %, it is found that the production of $(Cu,Ni)_6Sn_5$ is insufficient and that $Ni_3SnP$ is widely produced. A thickness D1 of a produced P-rich layer (layer where $Ni_3P$ is produced) is also large. Here, the thickness D1 of the P-rich layer correlates to the amount of Ni consumed in the Ni film 12. As the thickness D1 of the P-rich layer increases, the amount of Ni consumed in the Ni film 12 increases. On the other hand, as shown in FIGS. 5B to 5E, in a case where the Cu concentration in the first solder 14 is 1.7 wt % or higher, the production of $Ni_3SnP$ is not found, and it is found that $(Cu,Ni)_6Sn_5$ is sufficiently produced. It is found that the thickness D1 of the P-rich layer is also relatively small, and $(Cu,Ni)_6Sn_5$ covers the Ni film 12 and functions as a barrier layer.

Figure 6A:
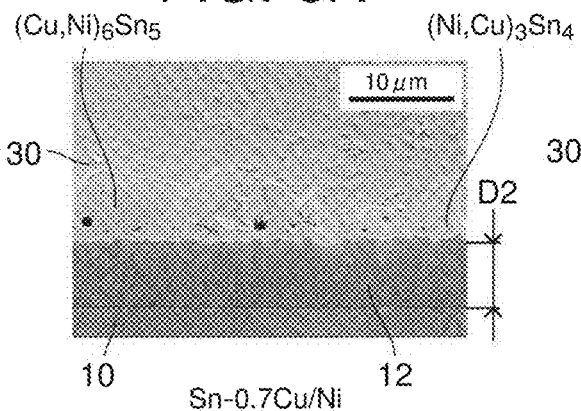
FIG. 6A is an electron micrograph showing a joint interface between a Ni film 12 (Ni) and a solder joint layer 30 having undergone soldering (the third heat treatment step)
Figure 6B:
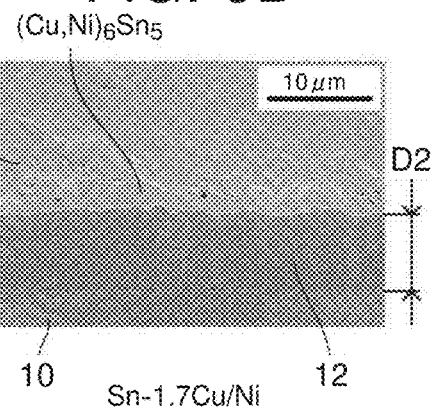
FIG. 6B is an electron micrograph showing a joint interface between a Ni film 12 (Ni) and a solder joint layer 30 having undergone soldering (the third heat treatment step)
Figure 6C:
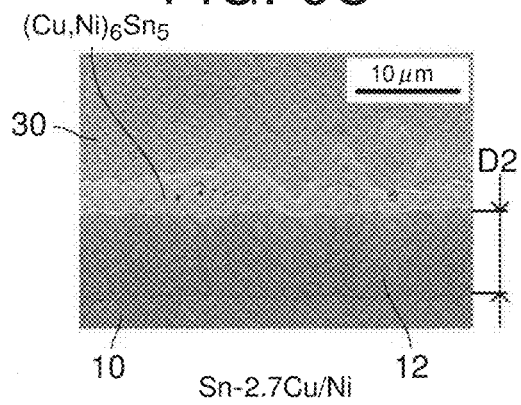
FIG. 6C is an electron micrograph showing a joint interface between a Ni film 12 (Ni) and a solder joint layer 30 having undergone soldering (the third heat treatment step)
Figure 6D:
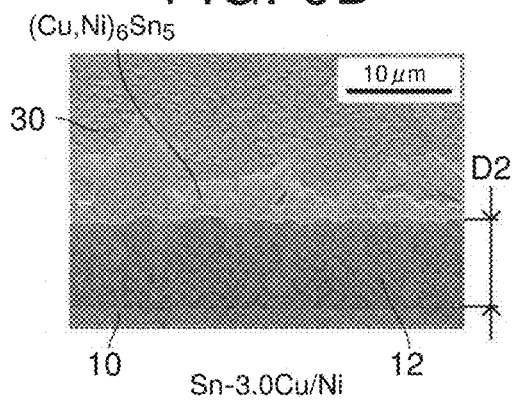
FIG. 6D is an electron micrograph showing a joint interface between a Ni film 12 (Ni) and a solder joint layer 30 having undergone soldering (the third heat treatment step)
Figure 6E:
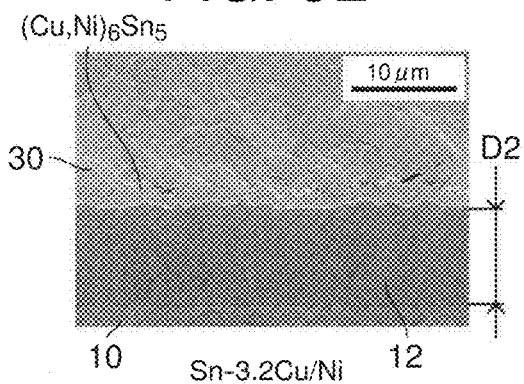
FIG. 6E is an electron micrograph showing a joint interface between a Ni film 12 (Ni) and a solder joint layer 30 having undergone soldering (the third heat treatment step)

Micrographs of FIGS. 6A to 6E are different from those of FIGS. 5A to 5E, in that an electroplating Ni layer is used as the Ni film 12. The Cu concentrations in the first solders 14 of FIGS. 6A to 6E are 0.7 wt %, 1.7 wt %, 2.7 wt %, 3.0 wt %, and 3.2 wt %, respectively. As shown in FIG. 6A, in a case where the Cu concentration in the first solder 14 is 0.7 wt %, it is found that the production of $(Cu,Ni)_6Sn_5$ is insufficient and that $(Ni,Cu)_3Sn_4$ is widely produced. A thickness D2 of the Ni film 12 is significantly reduced from the initial thickness D0. That is, it is found that a large amount of Ni is consumed in the Ni film 12. On the other hand, as shown in FIGS. 6B to 6E, in a case where the Cu concentration in the first solder 14 is 1.7 wt % or higher, the production of $(Ni,Cu)_3Sn_4$ is not found, and it is found that $(Cu,Ni)_6Sn_5$ is sufficiently produced. It is found that the amount of loss of the Ni film 12 (that is, a difference between D0 and D2) is also relatively small, and $(Cu,Ni)_6Sn_5$ covers the Ni film 12 and functions as a barrier layer.

It is found from the above-described experiment results that, in a case where the Cu concentrations in the first solder 14 and the second solder 24 are 1.7 wt % or higher, $(Cu,Ni)_6Sn_5$ is produced on each of the Ni films 12, 22 in an amount in which it can function as a barrier layer. However, in a case where the Cu concentration is 1.7 wt %, the melting temperature of the Sn—Cu solder is 250° C. to 260° C. (refer to FIG. 22). As described above, in the Sn—Cu solder, as the Cu concentration decreases, the melting temperature decreases. As a result, a target heating temperature in the first heat treatment step and the second heat treatment step can be decreased. Here, it is presumed from the above-described experiment results of FIGS. 5A to 5E and FIGS. 6A to 6E that, in a case where the Cu concentrations in the first solder 14 and the second solder 24 are lower than 1.7 wt %, $(Cu,Ni)_6Sn_5$ can be produced on each of the Ni films 12, 22 in an amount in which it can function as a barrier layer. Hereinafter, a case where the Cu concentrations in the first solder 14 and the second solder 24 is in a range of 0.7 wt % to 1.7 wt % will be further investigated.

Figure 8:
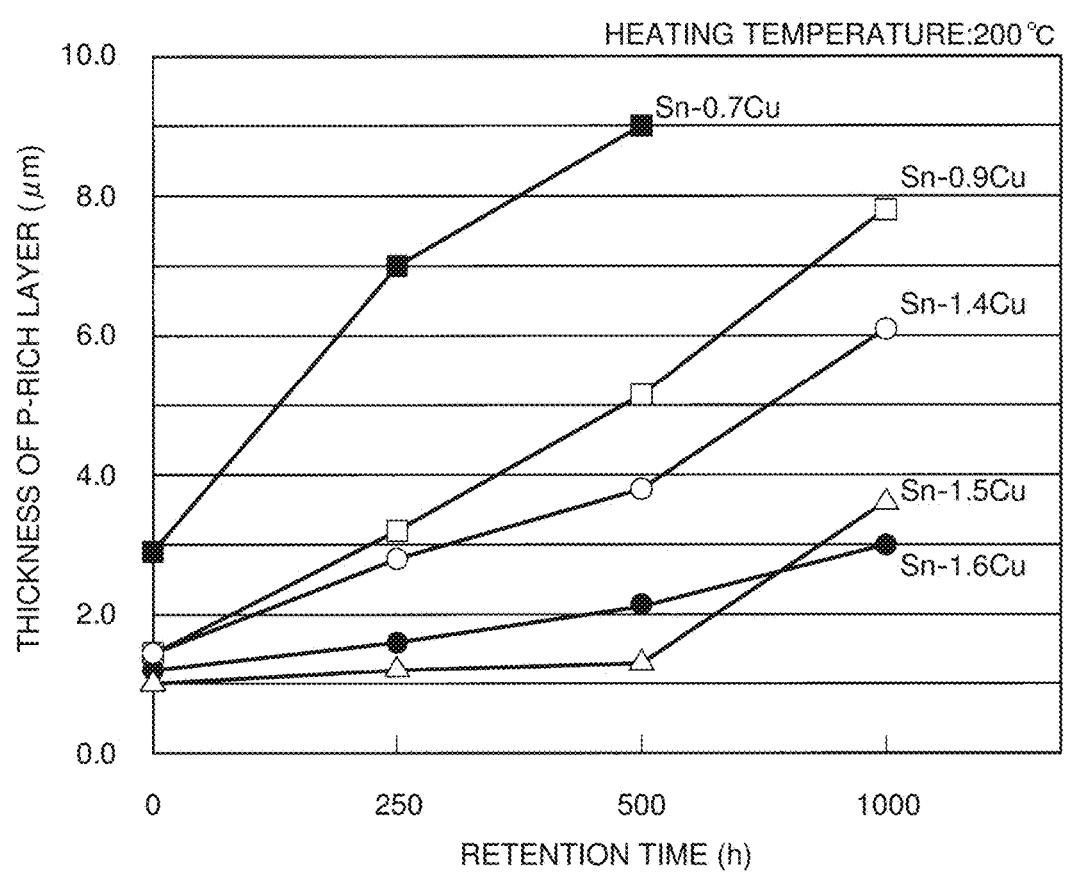
FIG. 8 is a graph showing growth of a P-rich layer measured at each of the Cu concentrations in the first solder 14 and the second solder 24 in a high-temperature durability test.
Figure 9A:
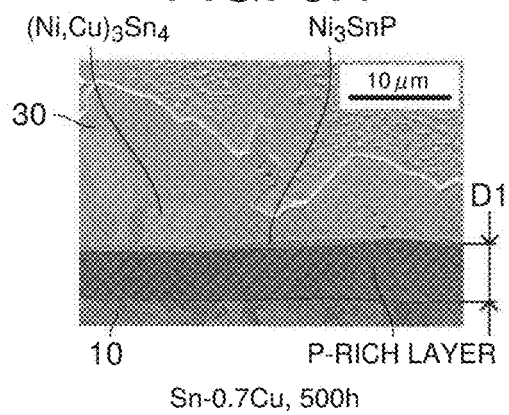
FIG. 9A is an electron micrograph showing the joint interface between the Ni film 12 (Ni—P) and the solder joint layer 30 after performing the high-temperature durability test for 500 hours, in which the Cu concentrations in the first and second solders 14, 24 are 0.7 wt %.
Figure 9B:
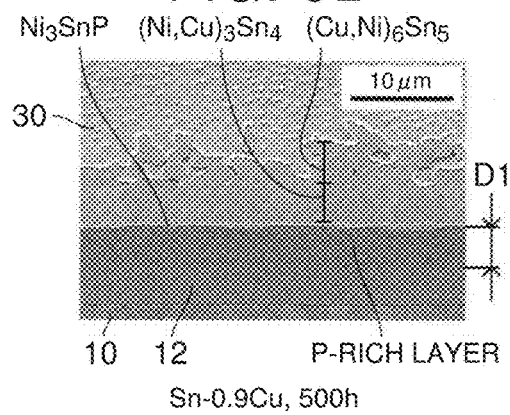
FIG. 9B is an electron micrograph showing the joint interface between the Ni film 12 (Ni—P) and the solder joint layer 30 after performing the high-temperature durability test for 500 hours, in which the Cu concentrations in the first and second solders 14, 24 are 0.9 wt %.
Figure 9C:
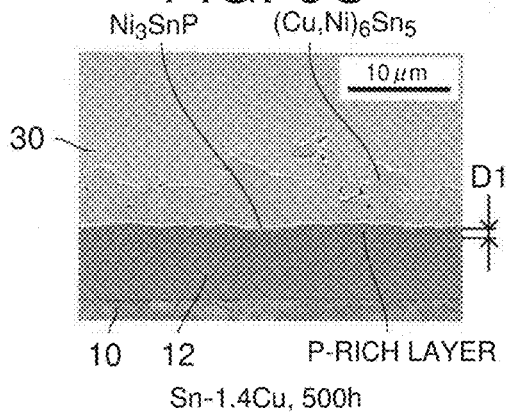
FIG. 9C is an electron micrograph showing the joint interface between the Ni film 12 (Ni—P) and the solder joint layer 30 after performing the high-temperature durability test for 500 hours, in which the Cu concentrations in the first and second solders 14, 24 are 1.4 wt %.
Figure 9D:
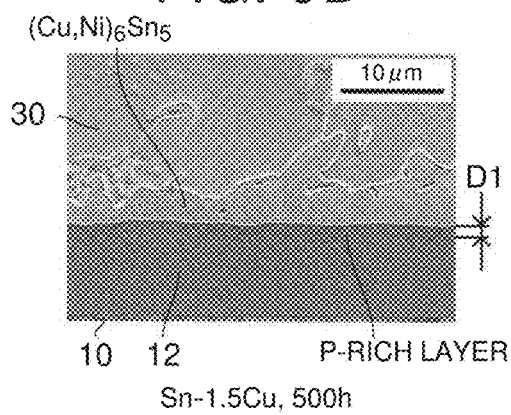
FIG. 9D is an electron micrograph showing the joint interface between the Ni film 12 (Ni—P) and the solder joint layer 30 after performing the high-temperature durability test for 500 hours, in which the Cu concentrations in the first and second solders 14, 24 are 1.5 wt %.
Figure 9E:
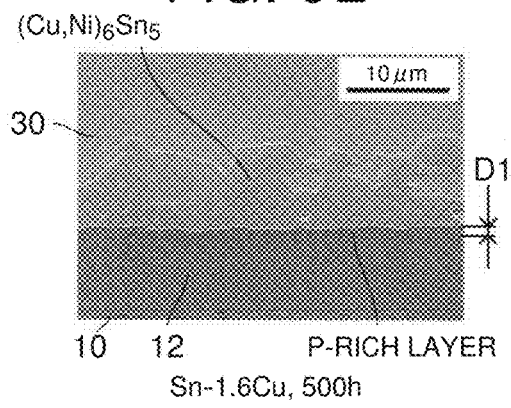
FIG. 9E is an electron micrograph showing the joint interface between the Ni film 12 (Ni—P) and the solder joint layer 30 after performing the high-temperature durability test for 500 hours, in which the Cu concentrations in the first and second solders 14, 24 are 1.6 wt %.
Figure 10A:
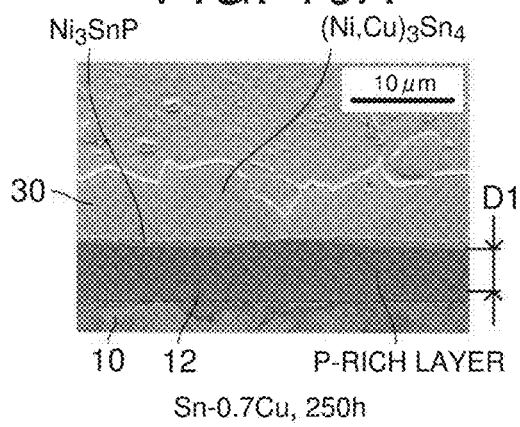
FIG. 10A is an electron micrograph showing the joint interface between the Ni film 12 (Ni—P) and the solder joint layer 30 after performing the high-temperature durability test for 250 hours, in which the Cu concentrations in the first and second solders 14, 24 are 0.7 wt %.
Figure 10B:
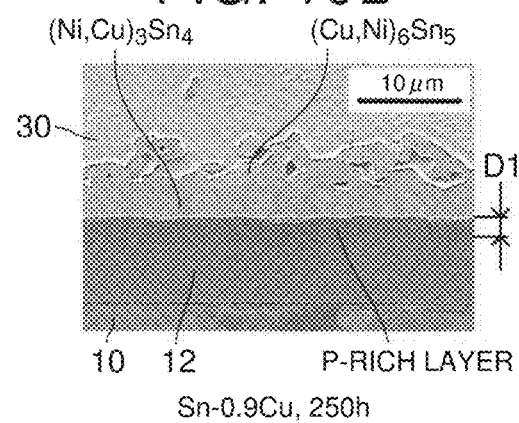
FIG. 10B is an electron micrograph showing the joint interface between the Ni film 12 (Ni—P) and the solder joint layer 30 after performing the high-temperature durability test for 250 hours, in which the Cu concentrations in the first and second solders 14, 24 are 0.9 wt %.
Figure 10C:
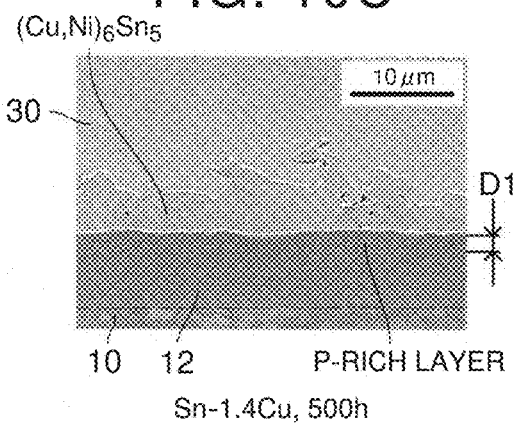
FIG. 10C is an electron micrograph showing the joint interface between the Ni film 12 (Ni—P) and the solder joint layer 30 after performing the high-temperature durability test for 500 hours, in which the Cu concentrations in the first and second solders 14, 24 are 1.4 wt %.
Figure 10D:
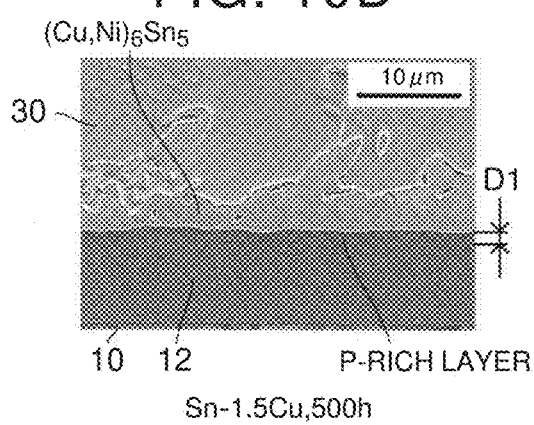
FIG. 10D is an electron micrograph showing the joint interface between the Ni film 12 (Ni—P) and the solder joint layer 30 after performing the high-temperature durability test for 500 hours, in which the Cu concentrations in the first and second solders 14, 24 are 1.5 wt %.
Figure 10E:
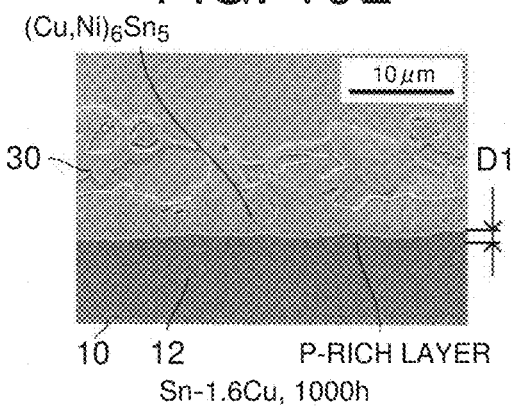
FIG. 10E is an electron micrograph showing the joint interface between the Ni film 12 (Ni—P) and the solder joint layer 30 after performing the high-temperature durability test for 1000 hours, in which the Cu concentrations in the first and second solders 14, 24 are 1.6 wt %.

FIGS. 9A to 10E shows the results of an experiment which was performed by the present inventors. In this experiment, a high-temperature durability test was performed in which samples having different Cu concentrations in the first solder 14 and the second solder 24 were left to stand in a high-temperature atmosphere of 200° C. In this experiment, the Ni films 12, 22 were electroless Ni—P plating layers, and the first member 10 and the second member 20 were Cu. In the evaluation of each of the samples, "Smallness of Amount of Ni Loss" and "Unlikeliness of Production of $(Ni,Cu)_3Sn_4$" are determined with reference to a reference case where the Cu concentration is 0.7 wt %. In a table shown in FIG. 7, the circle "O" represents that the evaluation item is more satisfactory than the reference (Ref). The more the number of circles, the better. Here, the item "Soldering" shows the results of observing and measuring the respective samples immediately after soldering, and the item "High-Temperature Durability (200° C.)" shows the results of observing and measuring the respective samples after the high-temperature durability test. FIG. 8 is a graph showing a relationship between a retention time in the high-temperature durability test (a period of time in which each of the samples was left to stand in a high-temperature atmosphere of 200° C.) and the measured thickness D1 of the P-rich layer. Here, "Smallness of Amount of Ni Loss" shown in FIG. 7 is evaluated based on the thickness D1 of the P-rich layer shown in FIG. 8.

As can be seen from FIGS. 8, 9A to 9E, and 10A to 10E, in the sample having a Cu concentration of 0.7 wt %, the Ni film 12 was almost completely lost after performing the high-temperature durability test for 500 hours, and the production of $(Ni,Cu)_3Sn_4$ was significant. On the other hand, in a case where the Cu concentration was 0.9 wt % or higher, the Ni film 12 remained after performing the high-temperature durability test for 500 hours, and the production of (Ni,Cu)3Sn4 was reduced. It is determined based on the above result that, in a case where the Cu concentrations in the first solder 14 and the second solder 24 are 0.9 wt % or higher, practicable soldering can be performed even on industrial products which may be exposed to a high temperature of 200° C.

Further, according to the graph shown in FIG. 8, as the Cu concentration increases, the thickness of the produced P-rich layer decreases. This shows that: as the Cu concentration increases, the thickness of $(Cu,Ni)_6Sn_5$ produced on the Ni films 12, 22 is large, and barrier properties obtained by $(Cu,Ni)_6Sn_5$ are satisfactory. In particular, it is found that, in the sample having a Cu concentration of 1.6 wt %, the production of the P-rich layer was stably prevented even after performing the high-temperature durability test for 500 hours to 1000 hours, and the (Cu,Ni)6Sn5 layer exhibits more satisfactory barrier properties. It is determined based on the above result that the Cu concentrations in the first solder 14 and the second solder 24 is more preferably 1.6 wt % or higher.

The soldering method disclosed in this specification can be applied to the manufacturing of various industrial products. Hereinafter, a method of manufacturing a semiconductor device 50 to which the soldering method disclosed in this specification is applied will be described as an example. Finally, a configuration of the semiconductor device 50 will be described with reference to FIGS. 11 to 15. This semiconductor device 50 is a power module which is used on a power supply path to a motor in an electric vehicle (including a hybrid car and a fuel cell vehicle).

Figure 11:
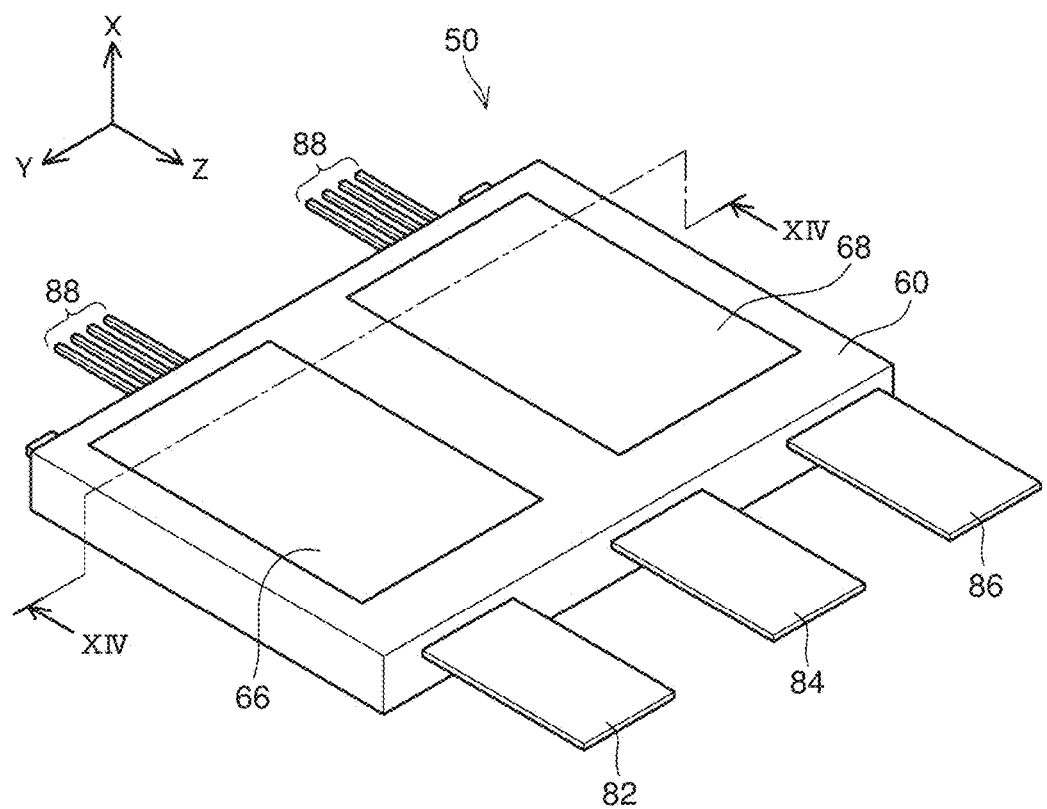
FIG. 11 is a perspective view schematically showing a semiconductor device 50.
Figure 12:
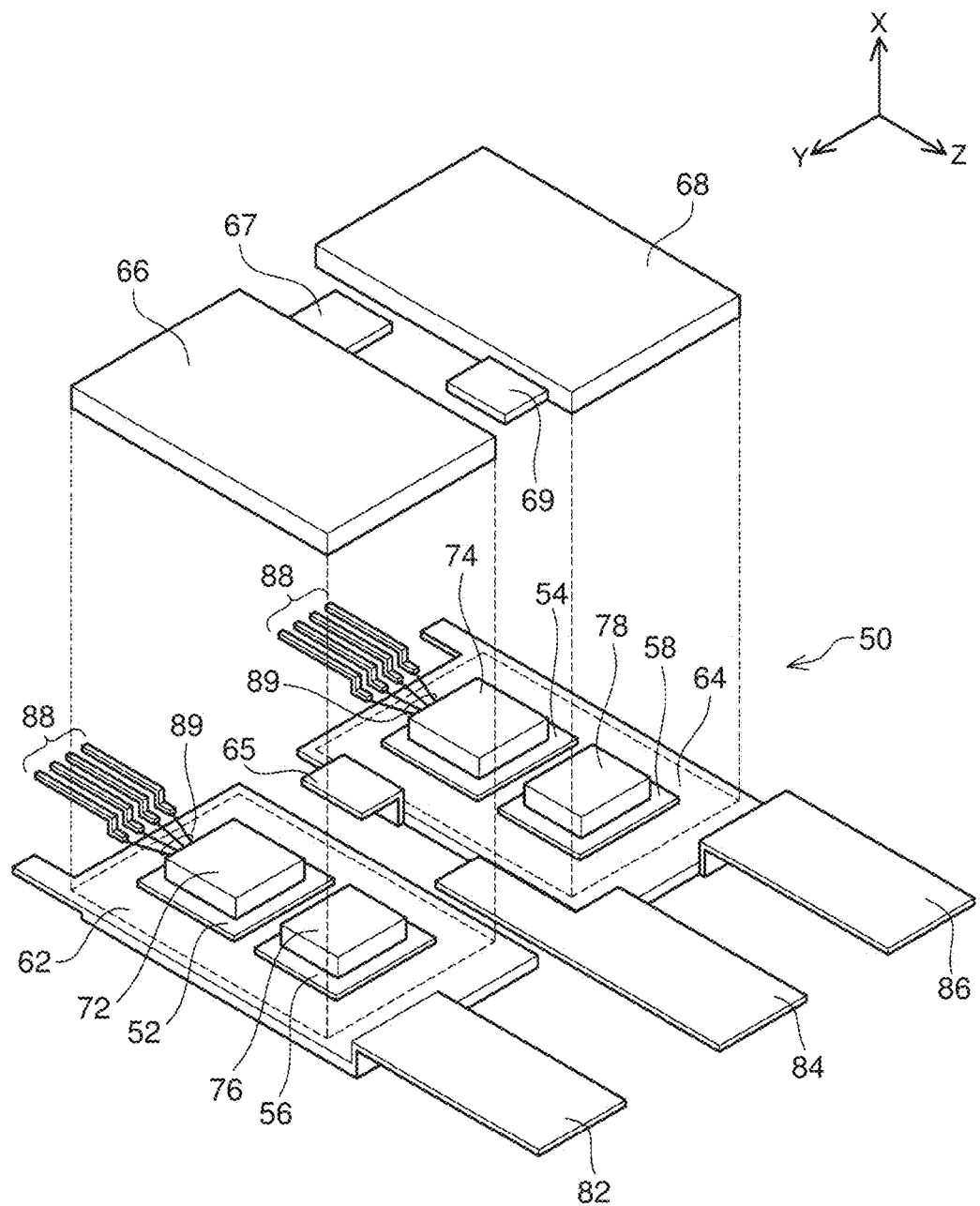
FIG. 12 is an exploded view schematically showing a structure of the semiconductor device 50, in which a resin package 60 is not shown.
Figure 13:
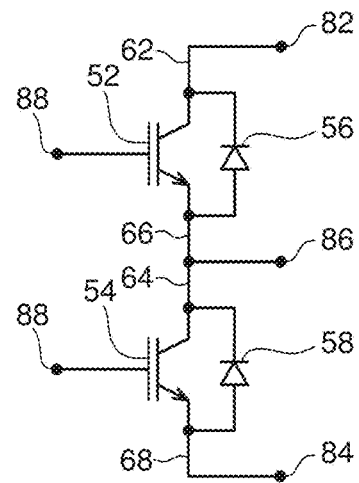
FIG. 13 is a circuit diagram showing an electrical configuration of the semiconductor device 50.

As shown in FIGS. 11 to 13, the semiconductor device 50 includes plural semiconductor elements 52, 54, 56, 58 and a resin package 60 that seals the semiconductor elements 52, 54, 56, 58. The plural semiconductor elements 52, 54, 56, 58 are a first transistor element 52, a second transistor element 54, a first diode element 56, and a second diode element 58. Each of the semiconductor elements 52, 54, 56, 58 has an allowable current of 100 A or higher and is considered to be a power semiconductor element. As shown in FIG. 13, the first transistor element 52 and the second transistor element 54 are electrically connected to each other in series. The first diode element 56 is electrically connected to the first transistor element 52 in reverse parallel, and the second diode element 58 is electrically connected to the second transistor element 54 in reverse parallel.

Figure 14:
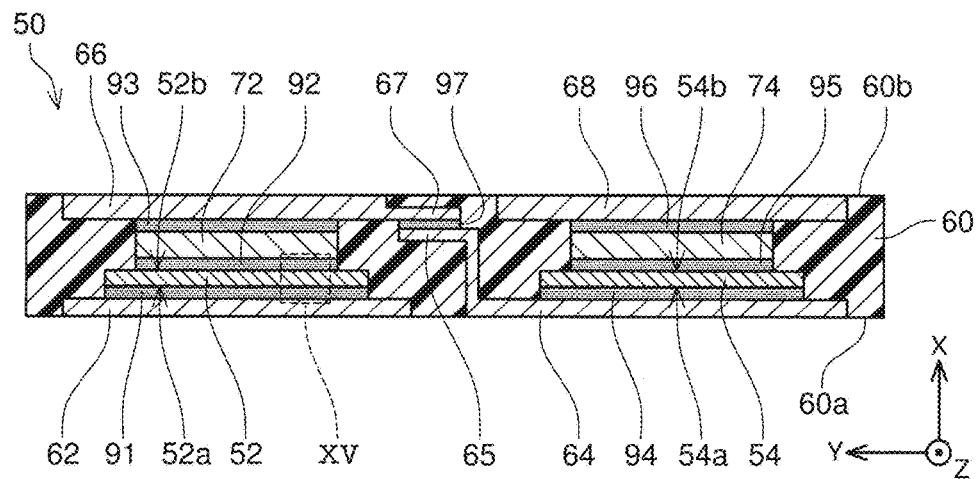
FIG. 14 is a sectional view taken along line XIV-XIV of FIG. 11.

The semiconductor device 50 further includes plural heat sinks 62, 64, 66, 68 and plural spacers 72, 74, 76, 78. Each of the plural heat sinks 62, 64, 66, 68 and the plural spacers 72, 74, 76, 78 is a conductive member and is formed of, for example, a metal material such as copper. Each of the heat sinks 62, 64, 66, 68 is exposed to a bottom surface 60a or a top surface 60b of the resin package 60 and dissipates heat of the plural semiconductor elements 52, 54, 56, 58 to the outside. As shown in FIG. 14, a bottom electrode 52a of the first transistor element 52 and the heat sink 62 are soldered to each other, and a solder joint layer 91 is formed between the bottom electrode 52a and the heat sink 62. A top electrode 52b of the first transistor element 52 and a bottom surface of the spacer 72 are soldered to each other, and a solder joint layer 92 is formed between the top electrode 52b and the bottom surface of the spacer 72. A top surface of the spacer 72 and the heat sink 66 are soldered to each other, and a solder joint layer 93 is formed between the top surface of the spacer 72 and the heat sink 66.

Likewise, a bottom electrode 54a of the second transistor element 54 and the heat sink 64 are soldered to each other, and a solder joint layer 94 is formed between the bottom electrode 54a and the heat sink 64. A top electrode 54b of the second transistor element 54 and a bottom surface of the spacer 74 are soldered to each other, and a solder joint layer 95 is formed between the top electrode 54b and the bottom surface of the spacer 74. A top surface of the spacer 74 and the heat sink 68 are soldered to each other, and a solder joint layer 96 is formed between the top surface of the spacer 74 and the heat sink 68. A joint 65 of the heat sink 64 and a joint 67 of the heat sink 66 are soldered to each other, and a solder joint layer 97 is formed between the joint 65 and the joint 67. Although not shown in the drawing, as in the case of the first transistor element 52 and the second transistor element 54, the first diode element 56 and the second diode element 58 are fixed to the heat sinks 62, 64, 66, 68 and the spacers 76, 78 by soldering.

Figure 15:
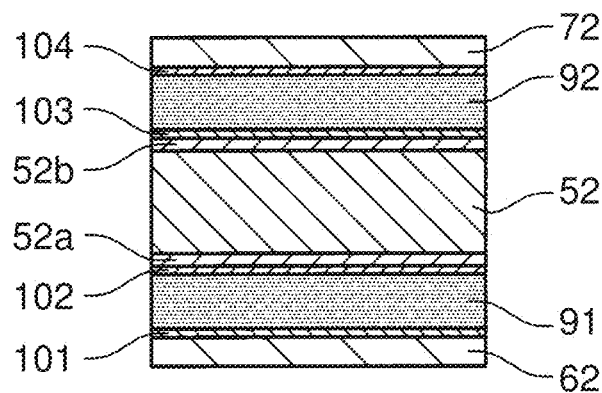
FIG. 15 is an enlarged view showing an XV portion of FIG. 14.

As shown in FIGS. 14 and 15, Ni films 101, 102 are formed on surfaces of the heat sink 62 and the first transistor element 52 contacting the solder joint layer 91, respectively. Ni films 103, 104 are formed on surfaces of the first transistor element 52 and the spacer 72 contacting the solder joint layer 92, respectively. Although not shown in the drawings, Ni films are also formed on surfaces of two members contacting each of the solder joint layers 93 to 97, respectively.

As shown in FIGS. 11 and 12, the semiconductor device 50 further includes a positive electrode terminal 82, a negative electrode terminal 84, an output terminal 86, and plural control terminals 88. The positive electrode terminal 82 is formed integrally with the heat sink 62. The negative electrode terminal 84 is soldered to a joint 69 of the heat sink 68. The output terminal 86 is formed integrally with the heat sink 64. Here, the heat sinks 62, 64, 66, 68 are electrically connected to the plural semiconductor elements 52, 54, 56, 58, respectively, to form a conductive path. Each of the control terminals 88 is connected a gate pad or another electrode pad of the first transistor element 52 or the second transistor element 54 through a bonding wire 89.

Figure 16:
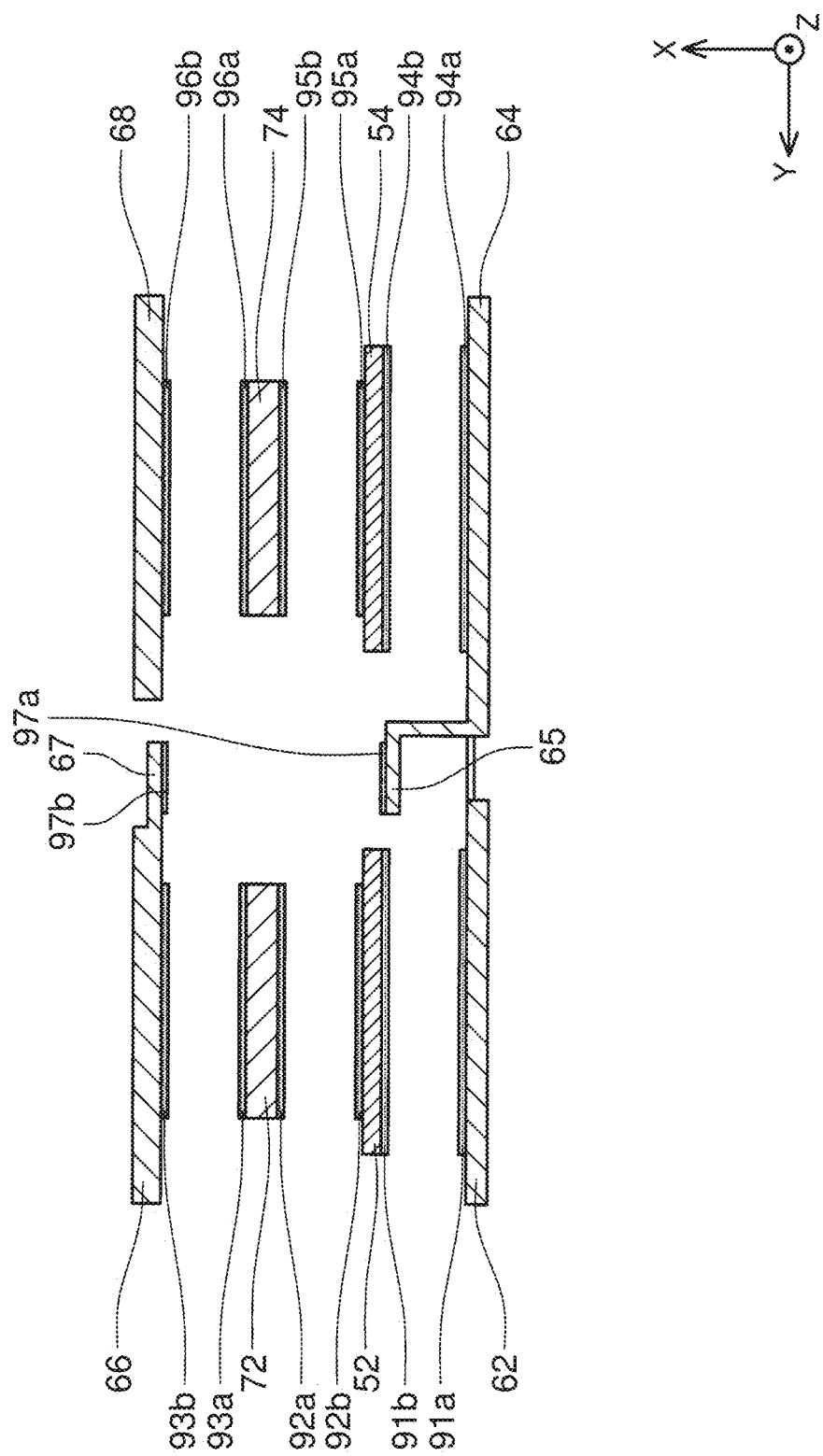
FIG. 16 is a diagram showing each member having undergone the first heat treatment step or the second heat treatment step in one step of a method of manufacturing the semiconductor device 50.

Hereinafter, a method of manufacturing the above-described semiconductor device 50 will be described with reference to FIGS. 16 to 21. First, as shown in FIG. 16, the first heat treatment step and the second heat treatment step are performed on two members to be soldered to each other. As a result, a solder is soldered to each of the members. For example, regarding the heat sink 62 and the first transistor element 52 to be soldered to each other, the first heat treatment step is performed on the heat sink 62, and the second heat treatment step is performed on the first transistor element 52. In the first heat treatment step, a first solder 91a which is a Sn—Cu solder is melted on the Ni film 101 formed on the heat sink 62 to produce $(Cu,Ni)_6Sn_5$ on the Ni film 101. On the other hand, in the second heat treatment step, a second solder 91b which is a Sn—Cu solder is melted on the Ni film 102 formed on the first transistor element 52 to produce $(Cu,Ni)_6Sn_5$ on the Ni film 102. Here, as described above, the first solder 91a and the second solder 91b contain 0.9 wt % or higher of Cu and preferably 1.6 wt % or higher of Cu. Likewise, regarding other soldering positions, the first heat treatment step or the second heat treatment step is performed on each of the members such that first solders 92a to 97a or second solders 92b to 97b are soldered to each of the members (the same applies to the first diode element 56 and other members not shown in FIG. 16).

Figure 17:
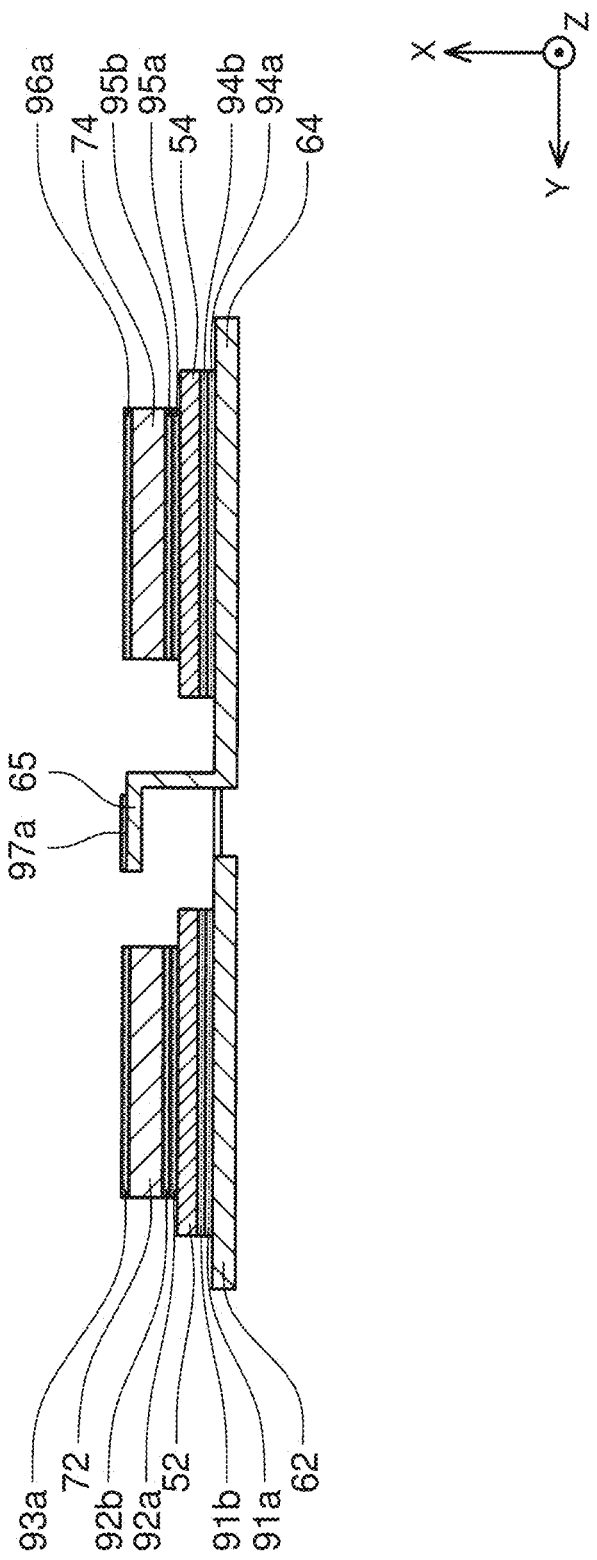
FIG. 17 is a diagram showing a semi-finished product in which partial members are combined in one step of the method of manufacturing the semiconductor device 50.

Next, as shown in FIG. 17, the first transistor element 52 and the spacer 72 are disposed on the heat sink 62 to overlap each other, and the second transistor element 54 and the spacer 74 are disposed on the heat sink 64 to overlap each other. At this time, the first solder 91a soldered to the heat sink 62 contacts or faces the second solder 91b soldered to the bottom surface of the first transistor element 52, and the first solder 92a soldered to the top surface of the first transistor element 52 contacts or faces the second solder 92b soldered to the bottom surface of the spacer 72. Regarding the second transistor element 54 side, similarly, the first solders 94a, 95a contact or face the corresponding second solder 94b, 95b, respectively. Although not shown in the drawings, the first diode element 56 and the spacer 76 are further disposed on the heat sink 62 to overlap each other, and the second diode element 58 and the spacer 78 are further disposed on the heat sink 64 to overlap each other. The heat sink 62 and the heat sink 64 can be prepared as a lead frame which is formed integrally with the plural control terminals 88 and the like.

Figure 18:
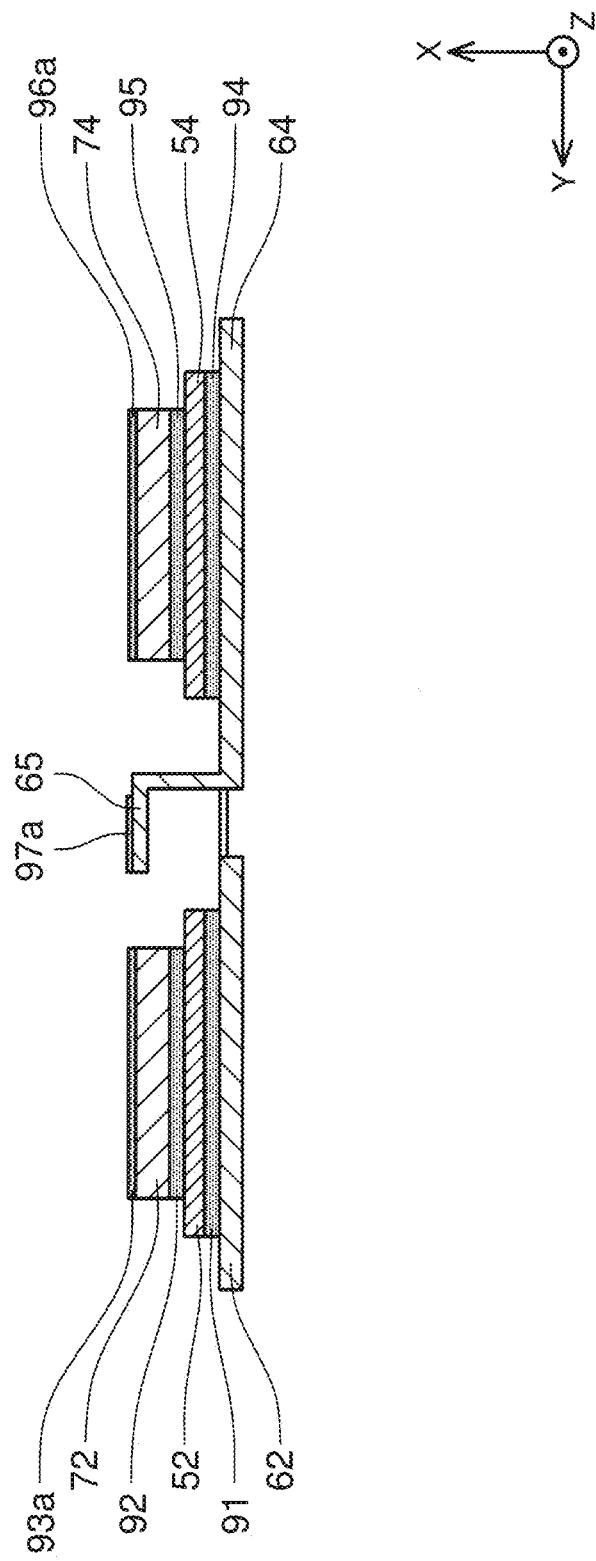
FIG. 18 is a diagram showing a semi-finished product having undergone the third heat treatment step in one step of the method of manufacturing the semiconductor device 50.

Next, as shown in FIG. 18, by performing the third heat treatment step, the first solders 91a, 92a, 94a, 95a soldered to the respective members and the second solders 91b, 92b, 94b, 95b soldered to the respective members are melted such that the first and second solders become integrated, respectively. As a result, the first transistor element 52 is joined to the heat sink 62 through the solder joint layer 91, and is joined to the spacer 72 through the solder joint layer 92. The second transistor element 54 is joined to the heat sink 64 through the solder joint layer 94, and is joined to the spacer 74 through the solder joint layer 95. Although not shown in the drawings, similarly, the first diode element 56 is joined to the heat sink 62 and the spacer 76 through the solder joint layer, and the second diode element 58 is joined to the heat sink 64 and the spacer 78 through the solder joint layer. Next, wire bonding is performed on the control terminals 88.

Figure 19:
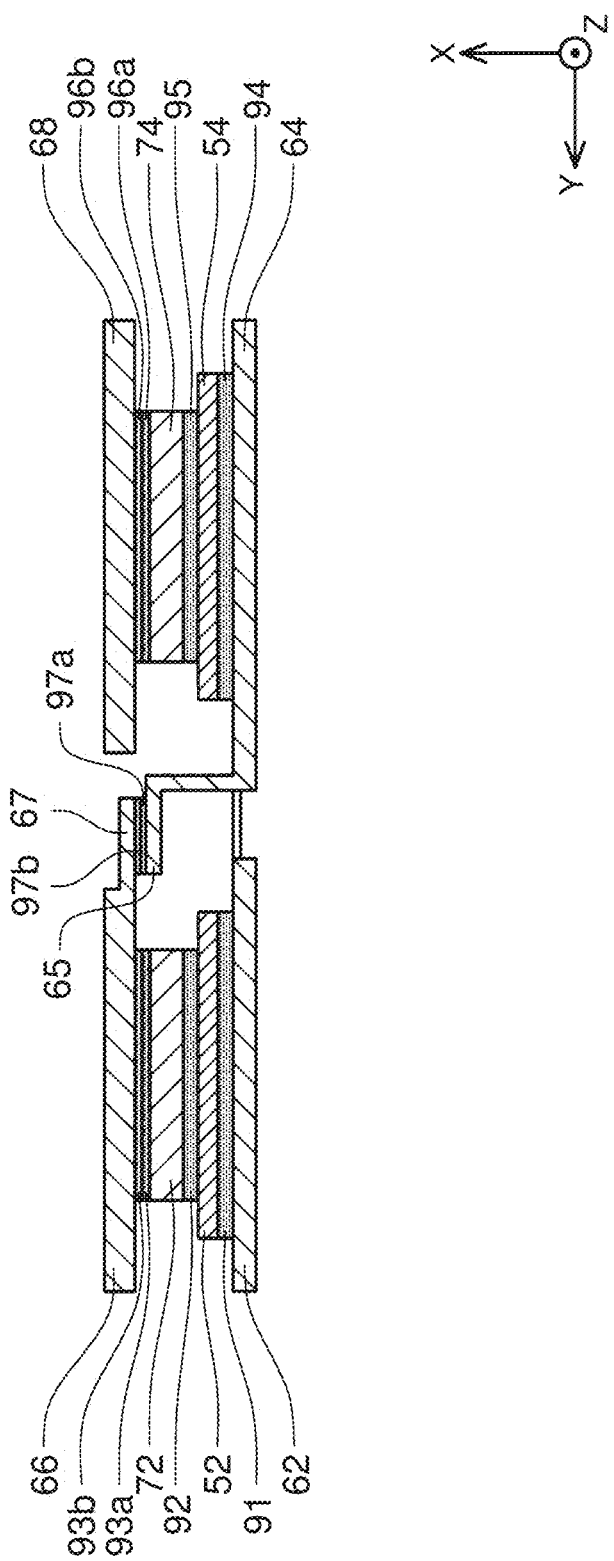
FIG. 19 is a diagram showing a semi-finished product in which additional members are also combined in one step of the method of manufacturing the semiconductor device 50.

Next, as shown in FIG. 19, the heat sinks 66, 68 are combined in a semi-finished product having undergone the above-described third heat treatment step. At this time, the first solder 93a soldered to the top surface of the spacer 72 contacts or faces the second solder 93b soldered to the bottom surface of the heat sink 66, and the first solder 96a soldered to the top surface of the spacer 74 contacts or faces the second solder 96b soldered to the bottom surface of the heat sink 68. The first solder 97a soldered to the joint 65 of the heat sink 64 contacts or faces the second solder 97b soldered to the joint 67 of the heat sink 66.

Figure 20:
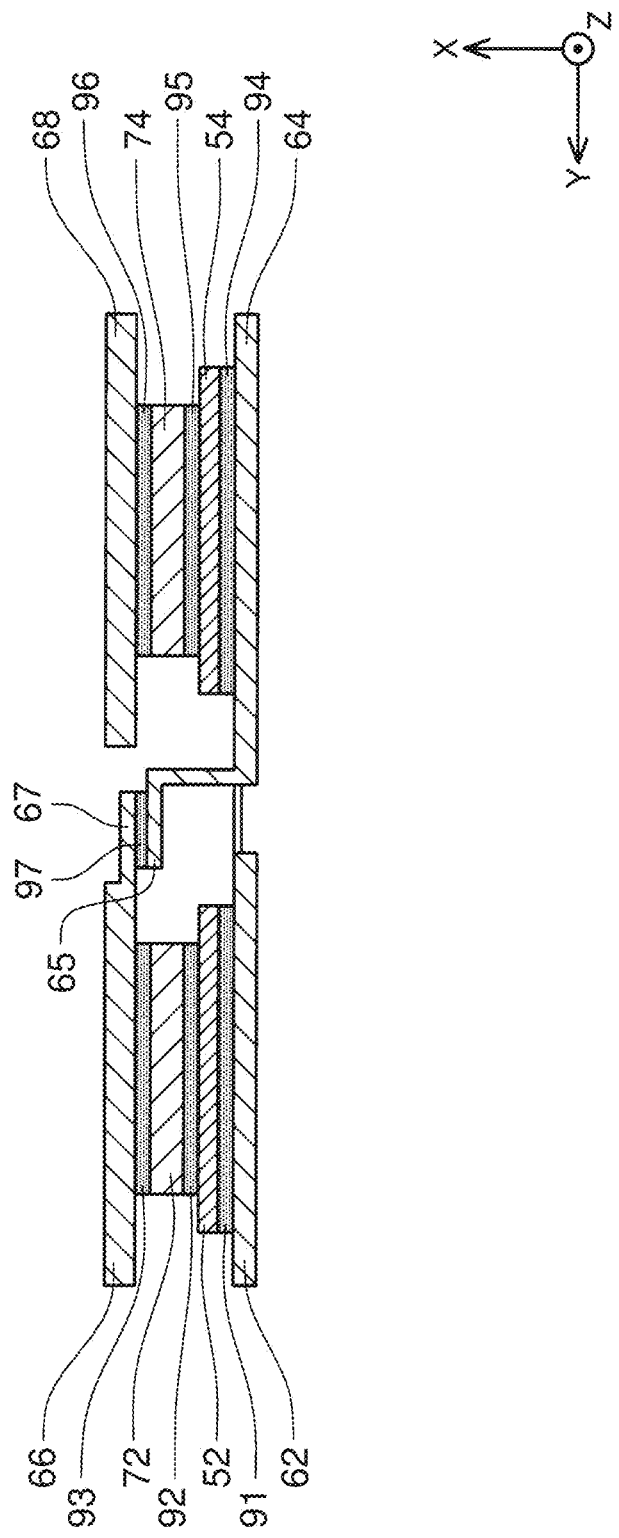
FIG. 20 is a diagram showing a semi-finished product having undergone the third heat treatment step again in one step of the method of manufacturing the semiconductor device 50.

Next, as shown in FIG. 20, by performing the third heat treatment step again, the first solders 93a, 96a, 97a soldered to the respective members and the second solders 93b, 96b, 97b, soldered to the respective members are melted such that the first and second solders become integrated, respectively. As a result, the heat sink 66 is joined to the spacer 72 through the solder joint layer 93, and the heat sink 68 is joined to the spacer 74 through the solder joint layer 96. The joint 67 of the heat sink 66 is joined to the joint 65 of the heat sink 64 through the solder joint layer 97. Although not shown in the drawings, the heat sink 66 is soldered to the spacer 76 on the first diode element 56, and the heat sink 68 is soldered to the spacer 78 on the second diode element 58.

Figure 21:
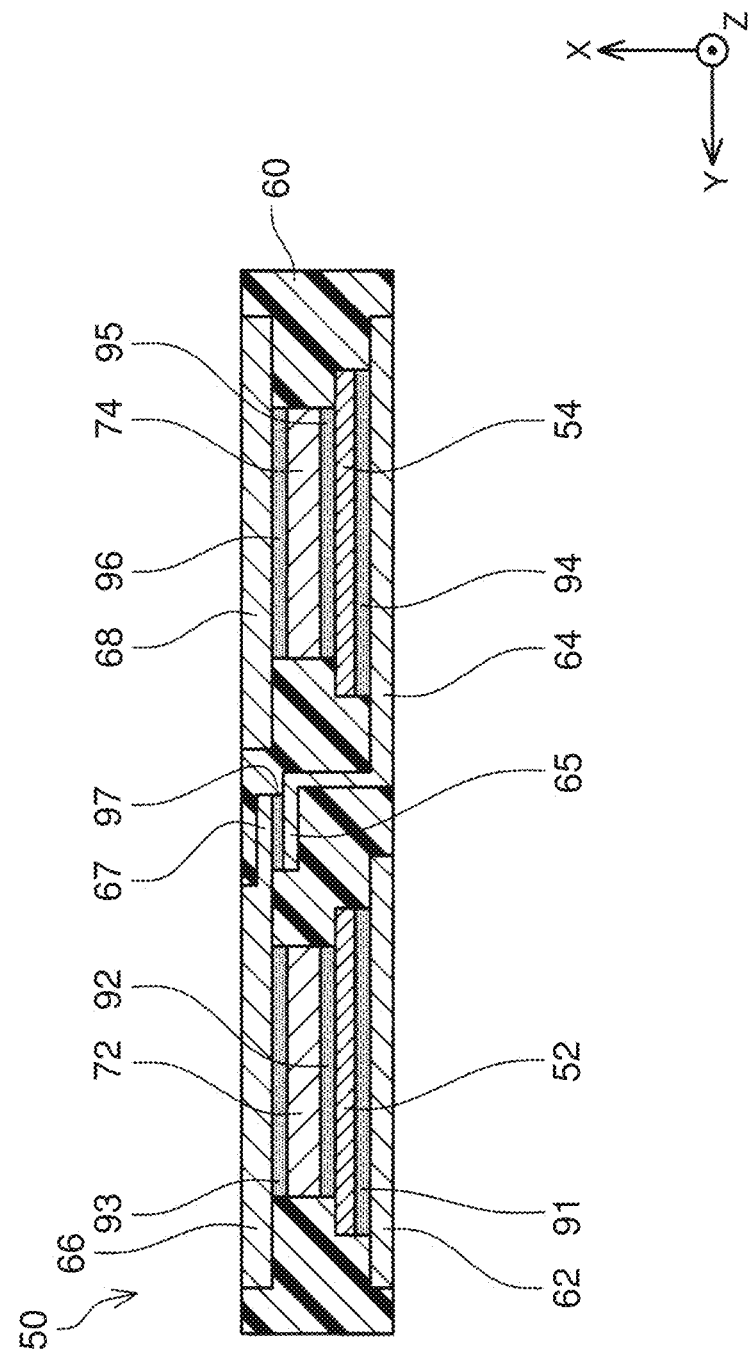
FIG. 21 is a diagram showing the semiconductor device 50 in which the resin package 60 is formed in one step of the method of manufacturing the semiconductor device 50.

Next, as shown in FIG. 21, the resin package 60 is formed by mold forming, and a lead frame cutting step and other necessary steps are performed. As a result, the semiconductor device 50 is completed.

The method of manufacturing the semiconductor device 50 is merely exemplary, and the soldering method disclosed in this specification can be applied to methods of manufacturing semiconductor devices having various configurations. However, the semiconductor device 50 includes the power semiconductor elements 52, 54, 56, 58, and by applying a high current thereto, the temperature of soldering positions may reach 200° C. Regarding this point, according to the above-described manufacturing method, a sufficient amount of $(Cu,Ni)_6Sn_5$ is produced on a Ni film (for example, the Ni films 101, 102, 103) of each of the members. As a result, even at a high temperature of 200° C., a barrier layer which can prevent conversion of the Ni film into an intermetallic compound can be formed. Accordingly, the above-described manufacturing method can be suitably applied to the method of manufacturing the semiconductor device 50 including the power semiconductor elements 52, 54, 56, 58. In the method of manufacturing the semiconductor device 50, the soldering method disclosed in this specification is applied to all of the plural soldering positions. The soldering method disclosed in this specification can be applied to only some of the plural soldering positions.

Hereinabove, some specific examples have been described in detail. However, these examples are merely exemplary and are not limiting. Various modifications and alternatives of the above-described specific examples are possible. Hereinafter, technical features conceived from the disclosure of this specification will be exemplified. The technical features described below are mutually independent and are technically useful alone or in various combinations.

This specification discloses the method of manufacturing a semiconductor device including a first member and a second member joined to the first member. This manufacturing method includes: a first heat treatment step of producing $(Cu,Ni)_6Sn_5$ on a Ni film formed on the first member by melting a first Sn—Cu solder containing 0.9 wt % or higher of Cu on the Ni film of the first member; a second heat treatment step of producing $(Cu,Ni)_6Sn_5$ on a Ni film formed on the second member by melting a second Sn—Cu solder containing 0.9 wt % or higher of Cu on the Ni film of the second member; and a third heat treatment step of joining the first member and the second member to each other by melting the first Sn—Cu solder having undergone the first heat treatment step and the second Sn—Cu solder having undergone the second heat treatment step such that the first and second Sn—Cu solders become integrated. According to the manufacturing method, even in a case where the Cu concentrations in the first and second Sn—Cu solders are relatively low, a predetermined amount of (Cu, Ni)$_6$Sn$_5$ can be produced on each of the Ni films of the first member and the second member.

In the above-described manufacturing method, a period of time in which the first Sn—Cu solder and the second Sn—Cu solder are melted in the third heat treatment step may be shorter than a period of time in which the first Sn—Cu solder is melted in the first heat treatment step and a period of time in which the second Sn—Cu solder is melted in the second heat treatment step. The third heat treatment step is not performed to produce an intermetallic compound. The first Sn—Cu solder and the second Sn—Cu solder can become integrated by simply melting them in the third heat treatment step. Therefore, a period of time in which the solders are melted in the third heat treatment step may be shorter than a period of time in which the solder is melted in the first heat treatment step and a period of time in which the solder is melted in the second heat treatment step. As a result, the time required to manufacture a semiconductor device can be reduced.

In the above-described manufacturing method, it is preferable that at least one of the first Sn—Cu solder or the second Sn—Cu solder contains 1.6 wt % or higher of Cu. As a result, (Cu,Ni)$_6$Sn$_5$ can be produced on the Ni film of at least one of the first member or the second member in an amount in which more satisfactory barrier properties can be exhibited.

In the above-described manufacturing method, it is preferable that at least one of the first member or the second member is a power semiconductor element. In a semiconductor device including a power semiconductor element, by applying a high current thereto, the temperature of soldering positions may reach, for example, 200° C. Regarding this point, according to the above-described manufacturing method, a sufficient amount of (Cu,Ni)$_6$Sn$_5$ is produced on a Ni film of each of the members. As a result, even at a high temperature of 200° C., a barrier layer which can prevent conversion of the Ni film into an intermetallic compound over a long period of time can be formed. Thus, heat resistance of the semiconductor device including a power semiconductor element can be significantly improved.

What is claimed is:

1. A method of manufacturing a semiconductor device which includes a first member and a second member joined to the first member, the method comprising:
   a) producing (Cu,Ni)$_6$Sn$_5$ on a Ni film formed on the first member by melting a first Sn—Cu solder containing 0.9 wt % or higher of Cu on the Ni film of the first member;
   b) producing (Cu,Ni)$_6$Sn$_5$ on a Ni film formed on the second member by melting a second Sn—Cu solder containing 0.9 wt % or higher of Cu on the Ni film of the second member, the second Sn—Cu solder being physically separated from the first Sn—Cu solder; and
   c) after the steps a) and b) have been completed so that (i) the (Cu,Ni)$_6$Sn$_5$ has been produced from the first Sn—Cu solder on the Ni film of the first member and (ii) the (Cu,Ni)$_6$Sn$_5$ has been produced from the second Sn—Cu solder on the Ni film of the second member, and the second Sn—Cu solder still is physically separated from the first Sn—Cu solder, joining the first member and the second member to each other by melting the first Sn—Cu solder having undergone step a) and by melting the second Sn—Cu solder having undergone step b) so that the first Sn—Cu solder and the second Sn—Cu solder become integrated.

2. The method according to claim 1, wherein a period of time in which the first Sn—Cu solder and the second Sn—Cu solder are melted in step c) is shorter than a period of time in which the first Sn—Cu solder is melted in step a) and is shorter than a period of time in which the second Sn—Cu solder is melted in step b).

3. The method according to claim 1, wherein at least one of the first Sn—Cu solder or the second Sn—Cu solder contains 1.6 wt % or higher of Cu.

4. The method according to claim 1, wherein at least one of the first member or the second member is a power semiconductor element.

5. The method according to claim 1, wherein step a) and step b) are performed simultaneously.

6. The method according to claim 1, wherein step a) and step b) are performed at different times.

7. The method according to claim 1, wherein the first Sn—Cu solder and the second Sn—Cu solder contain no more than 3.2 wt % of the Cu.

8. A method of manufacturing a semiconductor device which includes a first member and a second member joined to the first member, the method comprising:
   a) producing (Cu,Ni)$_6$Sn$_5$ on a Ni film formed on the first member by melting a first unit of Sn—Cu solder containing 0.9 wt % or higher of Cu on the Ni film of the first member;
   b) producing (Cu,Ni)$_6$Sn$_5$ on a Ni film formed on the second member by melting a second unit of Sn—Cu solder containing 0.9 wt % or higher of Cu on the Ni film of the second member, the second unit of Sn—Cu solder being physically separated from the first unit of Sn—Cu solder; and
   c) after the steps a) and b) have been completed so that (i) the (Cu,Ni)$_6$Sn$_5$ has been produced from the first unit of Sn—Cu solder on the Ni film of the first member and (ii) the (Cu,Ni)$_6$Sn$_5$ has been produced from the second unit of Sn—Cu solder on the Ni film of the second member, and the second unit of Sn—Cu solder still is physically separated from the first unit of Sn—Cu solder, joining the first member and the second member to each other by melting the first unit of Sn—Cu solder having undergone step a) and by melting the second unit of Sn—Cu solder having undergone step b) so that the first unit of Sn—Cu solder and the second unit of Sn—Cu solder become integrated into a single unit.

9. The method according to claim 8, wherein a period of time in which the first unit of Sn—Cu solder and the second unit of Sn—Cu solder are melted in step c) is shorter than a period of time in which the first unit of Sn—Cu solder is melted in step a) and is shorter than a period of time in which the second unit of Sn—Cu solder is melted in step b).

10. The method according to claim 8, wherein at least one of the first unit of Sn—Cu solder or the second unit of Sn—Cu solder contains 1.6 wt % or higher of Cu.

11. The method according to claim 8, wherein at least one of the first member or the second member is a power semiconductor element.

12. The method according to claim 8, wherein step a) and step b) are performed simultaneously.

13. The method according to claim 8, wherein step a) and step b) are performed at different times.

14. The method according to claim 8, wherein the first unit of Sn—Cu solder and the second unit of Sn—Cu solder contain no more than 3.2 wt % of the Cu.

* * * * *